(12) United States Patent
Shimizu et al.

(10) Patent No.: US 6,744,139 B2
(45) Date of Patent: Jun. 1, 2004

(54) SEMICONDUCTOR DEVICE

(75) Inventors: Ippei Shimizu, Tokyo (JP); Shu Shimizu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/237,011

(22) Filed: Sep. 9, 2002

(65) Prior Publication Data

US 2003/0127678 A1 Jul. 10, 2003

(30) Foreign Application Priority Data

Jan. 8, 2002 (JP) ........................................ 2002-001168

(51) Int. Cl.[7] ............................................. H01L 23/48
(52) U.S. Cl. ...................... 257/773; 257/750; 257/752; 257/775
(58) Field of Search ................................ 257/750, 752, 257/758, 773, 774, 775

(56) References Cited

U.S. PATENT DOCUMENTS

| 5,895,239 A | * | 4/1999 | Jeng et al. | 438/239 |
| 5,956,594 A | * | 9/1999 | Yang et al. | 438/396 |
| 6,022,776 A | * | 2/2000 | Lien et al. | 438/253 |
| 6,081,032 A | * | 6/2000 | Wu | 257/752 |
| 6,274,425 B1 | * | 8/2001 | Park | 438/241 |
| 6,333,548 B1 | * | 12/2001 | Yamane et al. | 257/652 |
| 6,426,546 B1 | * | 7/2002 | Chen et al. | 257/640 |
| 6,459,117 B1 | * | 10/2002 | Liou | 257/306 |
| 6,545,306 B2 | * | 4/2003 | Kim et al. | 257/296 |
| 6,559,486 B2 | * | 5/2003 | Ueda | 257/217 |

FOREIGN PATENT DOCUMENTS

| JP | 3-108338 | * | 5/1991 | ................ 257/758 |
| JP | 9-246382 | | 9/1997 | |

* cited by examiner

Primary Examiner—George Eckert
(74) Attorney, Agent, or Firm—Oblon, Spivak, McClelland, Maier & Neustadt, P.C.

(57) ABSTRACT

A semiconductor device is provided which is capable of reducing the number of masking processes in forming contact holes. The semiconductor device comprises a semiconductor substrate (1), a gate structure (9), a stopper film (11), an interlayer insulation film (12), a contact hole (17) extending from the upper surface (13) of the interlayer insulation film (12) to the semiconductor substrate (1), a metal material (18) buried in the contact hole (17), a first metal wiring layer (19), an interlayer insulation film (20), a contact hole (23) extending from the upper surface (21) of the interlayer insulation film (20) to the first metal wiring layer (19), and a contact hole (24) extending from the upper surface (21) of the interlayer insulation film (20) to a gate electrode (7) of the gate structure (9). The contact hole (24) is formed at the same time as the contact hole (23).

4 Claims, 10 Drawing Sheets

SEMICONDUCTOR DEVICE

BACKGROUND OF THE INVENTION

1. Field of the Invention

The present invention relates to a semiconductor device with gate structures.

2. Description of the Background Art

For semiconductor devices with gate structures, one conventional method of element isolation is the well-known LOCOS (Local Oxidation of Silicon) technique. FIG. 13 is a cross-sectional view in schematic form illustrating a semiconductor device structure using the LOCOS technique. As shown in FIG. 13, a conventional semiconductor device includes a semiconductor substrate 100, a plurality of MOS transistors 120 (one of which is shown in the drawing) and an interlayer insulation film 102 formed of, for example, silicon oxide film, wherein LOCOS isolation films 101 provide isolation between each of the MOS transistors 120. In the surface of the semiconductor substrate 100, a P-type well region 190, for example, is formed. The MOS transistors 120 each have N-type source/drain regions 103, for example, spaced at predetermined intervals in the well region 190 and a gate structure 110 formed on the surface of the semiconductor substrate 100 sandwiched between the source/drain regions 103. The gate structure 110 includes a layered structure 200 in which a gate insulating film 104, a polysilicon film 106, a tungsten silicide film 107 and an insulation film 109 are stacked one above another in order from the semiconductor substrate 100 side, and sidewalls 105 formed on the side surfaces of the layered structure 200. The polysilicon film 106 and the tungsten silicide film 107 form a gate electrode 108, and the insulation film 109 is formed of, for example, silicon oxide film. The interlayer insulation film 102 is formed on the semiconductor substrate 100 to cover the gate structure 110 and the LOCOS isolation films 101.

In the above-described semiconductor device, a contact hole 111 is formed in the interlayer insulation film 102 for providing connection between a metal wiring layer (not shown) to be formed on the interlayer insulation film 102 and one of the source/drain regions 103 of the MOS transistor 120. More specifically, as shown in FIG. 13, using a patterned resist 112 formed on the interlayer insulation film 102 as a mask, the interlayer insulation film 102 is selectively dry etched to form the contact hole 111 which extends from the upper surface of the interlayer insulation film 102 to the semiconductor substrate 100. At this time, if the contact hole 111 is formed out of position, it may extend through the source/drain region 103 to the well region 190. In this condition, when the contact hole 111 is filled with a metal material and a metal wiring layer is formed on the interlayer insulation film 102 to be connected to the metal material, the metal wiring layer and the well region 190 will be connected to each other.

To prevent such a short between the metal wiring layer and the well region 190, a method has been adopted for forming, after the formation of the contact hole 111, a diffusion layer of the same conductivity type as the source/drain regions 103, in this case a P-type diffusion layer, in the well region 190 appearing in the bottom of the contact hole 111. This method is called an "SAC (Self-Aligned Contact) implantation method".

By the way, the aforementioned LOCOS technique could no longer conform to further requirement for device miniaturization from the market and thus, an STI (Shallow Trench Isolation) technique has been adopted as another method of element isolation. In the STI technique, however, even if the SAC implantation method is used to solve the aforementioned problem, it is difficult to form a homogenous P-type diffusion layer in the well region 190 appearing in the bottom of the contact hole 111, because of a steeply inclined trench formed in the semiconductor substrate 100 for element isolation. To cope with this problem, the method hitherto adopted is, as shown in FIG. 14, to form, after the formation of the MOS transistors 120, a stopper film 115 on the semiconductor substrate 100 to cover the surface of the gate structure 110 of the MOS transistor 120 and then to form the interlayer insulation film 102 on the stopper film 115. This stopper film 115 is formed of, for example, silicon nitride film and acts as an etch stop when a contact hole is formed in the interlayer insulation film 102. FIG. 14 and FIG. 15 which will be described later are cross-sectional views in schematic form illustrating a semiconductor device structure using STI isolation films 113 instead of the LOCOS isolation films 101 in the semiconductor device shown in FIG. 13.

As shown in FIG. 14, in order to provide connection between one of the source/drain regions 103 of the MOS transistor 102 and a metal wiring layer (not shown) formed in the upper part, the interlayer insulation film 102 is first selectively etched using the stopper film 115 as an etch stop to form a contact hole 114. Then, as shown in FIG. 15, the exposed stopper film 115 is selectively etched to form a contact hole 16, thereby completing the formation of a contact hole 111 which extends from the upper surface of the interlayer insulation film 102 to the semiconductor substrate 100. The process of forming the contact hole 111 extending from the upper surface of the interlayer insulation film 102 to the semiconductor substrate 100 in this way can be divided into two steps: the step of etching the interlayer insulation film 102 and the step of etching the stopper film 115, whereby the amount of the semiconductor substrate 100 to be etched by the formation of the contact hole 111 can be reduced. This prevents a short between the upper metal wiring layer and the well region 190.

To illustrate the above in a concrete form, the amount of overetch when forming a contact hole shall, for example, be 30% of the thickness of a film to be etched. For example, where the interlayer insulation film 102 has a thickness of 500 nm and no stopper film 115 is formed as in the semiconductor device shown in FIG. 13, the semiconductor substrate 100 will be etched to a depth of 150 nm from its upper surface, when the contact hole 111 is formed. In this case, the contact hole 111, if formed out of position, can extend to the well region 190.

In the semiconductor device with the stopper film 115 as shown in FIGS. 14 and 15, on the other hand, although the step of etching the stopper film 115 after etching of the interlayer insulation film 102 must additionally be provided, the thickness of the stopper film 115 is very small as compared with the interlayer insulation film 102 and thus, the amount of the semiconductor substrate 100 to be etched when the contact hole 111 is formed will be less than would be the case where the semiconductor device has no stopper film 115. To be more specific, where the stopper film 115 has a thickness of 50 nm, the semiconductor substrate 100 will be etched to a depth of only 15 nm from its upper surface when the contact hole 116 is formed. Thus, even if the contact hole 111 is formed out of position, it will not extend to the well region 190 as shown in FIG. 15.

Next, how, in the semiconductor device shown in FIGS. 14 and 15, the source/drain region 103 or the gate electrode 108 of the gate structure 110 is connected to the upper metal wiring layer formed in the interlayer insulation film 102 will be described in more detail with reference to FIGS. 16 to 20. FIGS. 16 to 20 are partial views of the semiconductor device shown in FIGS. 14 and 15.

First, as shown in FIG. 16, the source/drain regions 103 and the gate structure 110 of the MOS transistor 120 are formed and the stopper film 115 is formed on the semiconductor substrate 100 to cover the surface of the gate structure 110. Further, the interlayer insulation film 102 is formed on the stopper film 115 and the patterned resist 112 is formed on the interlayer insulation film 102. Using the resist 112 as a mask, the interlayer insulation film 102 is selectively etched to form the contact hole 114 which extends from the upper surface of the interlayer insulation film 102 to the stopper film 115. At this time, the stopper film 115 is used as an etch stop. Then, as shown in FIG. 17, the exposed stopper film 115 is selectively etched to form the contact hole 116, thereby completing the formation of the contact hole 111 which extends from the upper surface of the interlayer insulation film 102 to the semiconductor substrate 100.

The resist 112 used in the formation of the contact hole 111 is removed and, as shown in FIG. 18, a new resist 112 with a predetermined pattern is formed on the interlayer insulation film 102. Then, using the resist 112 as a mask, the interlayer insulation film 102, the stopper film 115 and the insulation film 109 of the gate structure 110 are selectively etched to form a contact hole 117 which extends from the upper surface of the interlayer insulation film 102 to the gate electrode 108 of the gate structure 110. At this time, etching is performed with no selectivity between each of the interlayer insulation film 102, the stopper film 115 and the insulation film 109 but with selectivity between the gate electrode 108 and each of the interlayer insulation film 102, the stopper film 115 and the insulation film 109. To be more specific, since, as above described, the interlayer insulation film 102 and the insulation film 109 are of silicon oxide film, the stopper film 115 is of silicon nitride film, and the upper part of the gate electrode 108 is of the tungsten silicide film 107, the contact hole 117 should be formed by etching with no selectivity between the silicon oxide film and the silicon nitride film but with selectivity between the tungsten silicide film 107 and each of the silicon oxide film and the silicon nitride film.

Then, as shown in FIG. 19, the resist 112 is removed, and metal materials 118 and 121 are buried respectively in the contact holes 111 and 117. After that, on the interlayer insulation film 102, a first metal wiring layer 119 is formed to be connected to the metal material 118 and a first metal wiring layer 122 is formed to be connected to the metal material 121. This provides connection between the source/drain regions 103 and the upper first metal wiring layer 119 and between the gate electrode 108 of the gate structure 110 and the upper first metal wiring layer 122. Then, as shown in FIG. 20, second metal wiring layers 127 and 128 formed in the upper reaches of the first metal wiring layers 119 and 122 are connected respectively to the first metal wiring layers 119 and 122. More specifically, an interlayer insulation film 129 is formed on the interlayer insulation film 102 to cover the first metal wiring layers 119 and 122. The interlayer insulation film 129 is then selectively etched using a resist with a predetermined pattern as a mask, thereby to form a contact hole 123 which extends from the upper surface of the interlayer insulation film 129 to the first metal wiring layer 119 and a contact hole 124 which extends from the upper surface of the interlayer insulation film 129 to the first metal wiring layer 122. Further, metal materials 125 and 126 are buried respectively in the contact holes 123 and 124. Then, by forming the second metal wiring layers 127 and 128 on the interlayer insulation film 129 to be connected to the metal materials 125 and 126, respectively, connection is provided between the second metal wiring layer 127 and the first metal wiring layer 119 and between the second metal wiring layer 128 and the first metal wiring layer 122. This results in connection between the source/drain region 103 and the second metal wiring layer 127 and between the gate electrode 108 of the gate structure 110 and the second metal wiring layer 128.

Here, as a means for improving efficiency in semiconductor device manufacturing, it is generally required to reduce the number of masking processes. In the aforementioned conventional semiconductor device manufacturing process illustrated in FIGS. 16 to 20, in order to reduce masking processes, it is contemplated, for example, to form the contact holes 111 and 117 at the same time. However, simultaneous proper formation of the contact holes 111 and 117 is difficult for the following reason. If the contact holes 111 and 117 are simultaneously formed by the etching used for forming the contact hole 117 in accordance with a distance (hereinafter referred to as a "distance x") from the upper surface of the interlayer insulation film 102 to the surface of the semiconductor substrate 100, even if the etching has selectivity to the tungsten silicide film 107 of the gate electrode 108, the contact hole 117 may extend through the tungsten silicide film 107 because of a difference between the distance x and a distance (hereinafter referred to as a "distance y") from the upper surface of the interlayer insulation film 102 to the upper surface of the gate electrode 108 of the gate structure 110. Or if the contact holes 111 and 117 are simultaneously formed in accordance with the distance y by the etching used for forming the contact hole 117, the formation of the contact hole 111 extending to the semiconductor substrate 100 may not be completed.

Further, even when the interlayer insulation film 102 is first etched to the stopper film 115 by using the stopper film 115 as an etch stop and then the remaining portions are etched at the same time, it is difficult to simultaneously form the contact holes 111 and 117 properly. More specifically, while the insulation film 109 is formed between the stopper film 115 on the gate structure 110 and the gate electrode 108, between the stopper film 115 on the source/drain regions 103 and the semiconductor substrate 100 is an oxide film (not shown) which could not completely be removed during process and which is extremely thin as compared with the insulation film 109. Thus, even when the interlayer insulation film 102 is first etched to the stopper film 115 and then the remaining portions are simultaneously etched, because of different layer structures of the remaining parts, it will be difficult to simultaneously form the contact holes 111 and 117 properly. As above described, the conventional semiconductor device manufacturing method illustrated in FIGS. 16 to 20 has difficulty in reducing the number of masking processes.

SUMMARY OF THE INVENTION

An object of the present invention is to provide a semiconductor device which is capable of reducing the number of masking processes in forming contact holes.

The semiconductor device according to the present invention includes a semiconductor substrate, a gate structure, an active region, a stopper film, a first interlayer insulation film, a first contact hole, a metal material, a metal wiring layer, a second interlayer insulation film, a second contact hole, and a third contact hole. The gate structure is selectively formed on the semiconductor substrate and has a layered structure in which a gate electrode and an insulation film are stacked one above the other in order from the semiconductor substrate side. The active region is formed in a main surface of the semiconductor substrate. The stopper film covers a whole surface of the gate structure and is formed on the active region. The first interlayer insulation film is formed on the stopper film. The first contact hole extends from an upper surface of the first interlayer insulation film to the active region. The metal material is buried in the first contact hole. The metal wiring layer is formed on the first interlayer insulation film to be connected to the metal material. The second interlayer insulation film is formed on the first interlayer insulation film to cover the metal wiring layer. The second contact hole extends from an upper surface of the second interlayer insulation film through the first interlayer insulation film, the stopper film and the insulation film to the gate electrode of the gate structure. The third contact hole extends from the upper surface of the second interlayer insulation film to the metal wiring layer and is shallower than the second contact hole. An etch rate of a film in forming the second and third contact holes is larger than that of the metal wiring layer.

In this semiconductor device, the second contact hole is provided which extends from the upper surface of the second interlayer insulation film to the gate electrode of the gate structure. This second contact hole can be formed at the same time as the third contact hole extending from the upper surface of the second interlayer insulation film to the metal wiring layer. Accordingly, a smaller number of masking processes is required when manufacturing the semiconductor device according to the second aspect than would be required when manufacturing a semiconductor device which includes, instead of the second contact hole, contact holes formed independently in the first and second interlayer insulation films.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
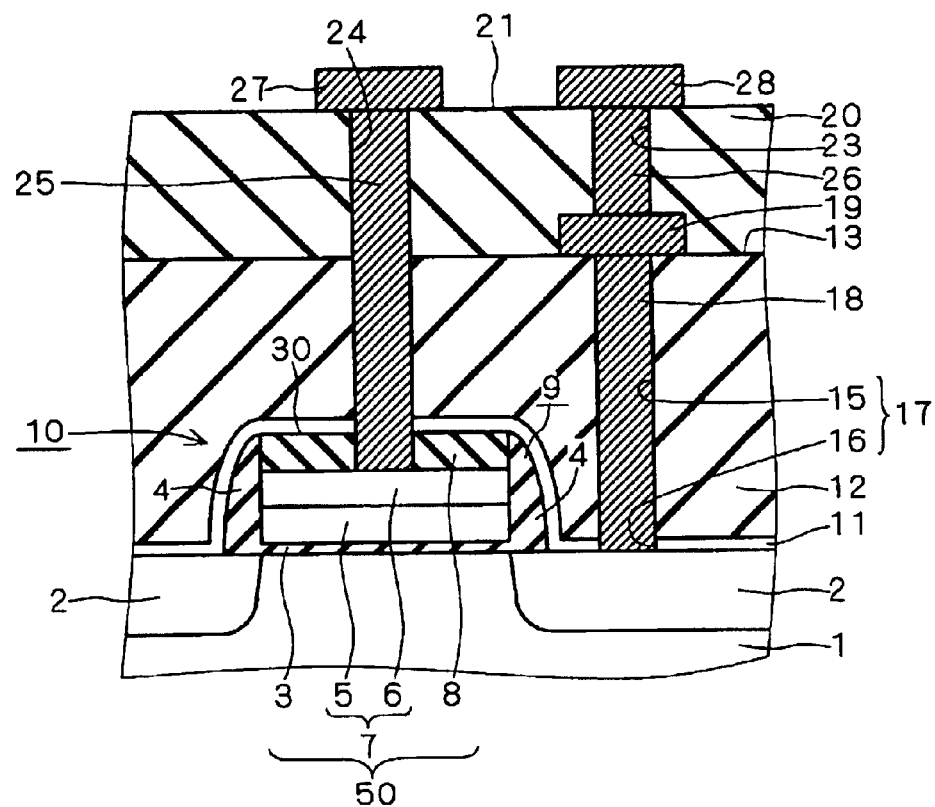
FIG. 1 is a cross-sectional view illustrating a semiconductor device structure according to a preferred embodiment of the present invention.

FIG. 1 is a cross-sectional view in schematic form illustrating a semiconductor device structure according to a preferred embodiment of the present invention. As shown in FIG. 1, a semiconductor device according to this preferred embodiment includes: a semiconductor substrate 1 having source/drain regions (active regions) 2 spaced therein at predetermined intervals; a gate structure 9 selectively formed on the semiconductor substrate 1 and having a layered structure 50 in which a gate insulating film 3, a gate electrode 7 and an insulation film 8 are stacked one above another in order from the semiconductor substrate 1 side; a stopper film 11 formed on the semiconductor substrate 1 to cover a surface 30 of the gate structure 9; an interlayer insulation film 12 formed on the stopper film 11; a contact hole 17 extending from an upper surface 13 of the interlayer insulation film 12 to one of the source/drain regions 2 of the semiconductor substrate 1; a metal material 18 buried in the contact hole 17; a first metal wiring layer 19 formed on the interlayer insulation film 12 to be connected to the metal material 18; an interlayer insulation film 20 formed on the interlayer insulation film 12 to cover the first metal wiring layer 19; a contact hole 23 extending from an upper surface 21 of the interlayer insulation film 20 to the first metal wiring layer 19; a contact hole 24 extending from the upper surface 21 of the interlayer insulation film 20 to the gate electrode 7 of the gate structure 9; a metal material 25 buried in the contact hole 24; a metal material 26 buried in the contact hole 23; a second metal wiring layer 28 formed on the interlayer insulation film 20 to be connected to the metal material 26; and a second metal wiring layer 27 formed on the interlayer insulation film 20 to be connected to the metal material 25.

The gate structure 9 further has sidewalls 4 formed on the side surfaces of the layered structure 50 and is formed on the surface of the semiconductor substrate 1 sandwiched between the source/drain regions 2. The gate electrode 7 includes a polysilicon film 5 and a tungsten silicide film 6 which are stacked one above the other in order from the semiconductor substrate 1 side. The semiconductor substrate 1 is, for example, a P-type semiconductor substrate and the source/drain regions 2 are of, for example, N-type conductivity. The source/drain regions 2 and the gate structure 9 form an MOS transistor 10. It is also possible to form a well region in the surface of the semiconductor substrate 1 and then to form the source/drain regions 2 within the well region. The contact hole 17 includes a contact hole 15 formed in the interlayer insulation film 12 and a contact hole 16 formed in the stopper film 11. The insulation film 8 and the interlayer insulation films 12 and 20 are formed of, for example, silicon oxide film and the stopper film 11 is formed of, for example, silicon nitride film. The metal materials 18, 25 and 26 are made of, for example, tungsten and the first metal wiring layer 19 and the second metal wiring layers 27 and 28 are made of, for example, aluminum.

Figure 2:
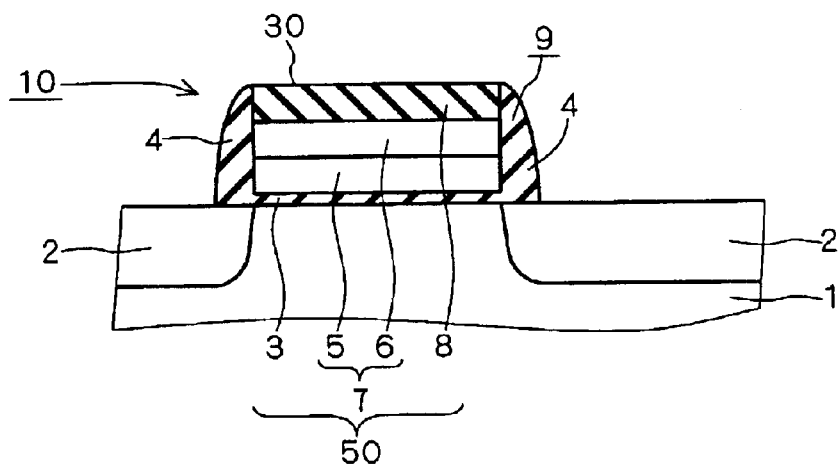
FIGS. 2 to 10 are cross-sectional views illustrating the manufacturing process of a semiconductor device according to the preferred embodiment of the present invention.
Figure 3:
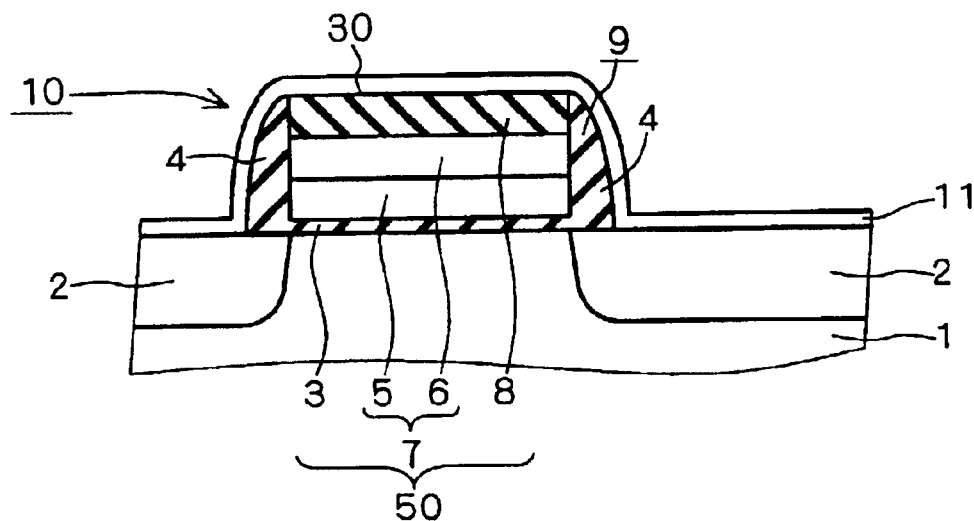

Next, a method of manufacturing the semiconductor device of FIG. 1 according to this preferred embodiment will be described. FIGS. 2 through 10 are cross-sectional views illustrating the manufacturing process of the semiconductor device according to this preferred embodiment. First, as shown in FIG. 2, the semiconductor substrate 1 is prepared and the source/drain regions 2 of the MOS transistor 10 are formed in the surface of the semiconductor substrate 1. Also, the gate structure 9 with the layered structure 50 is selectively formed on the semiconductor substrate 1 so that the gate insulating film 3, the gate electrode 7 and the insulation film 8 are located in order from the semiconductor substrate 1 side. Then, as shown in FIG. 3, the stopper film 11 is formed on the semiconductor substrate 1 to cover the surface 30 of the gate structure 9.

Figure 4:
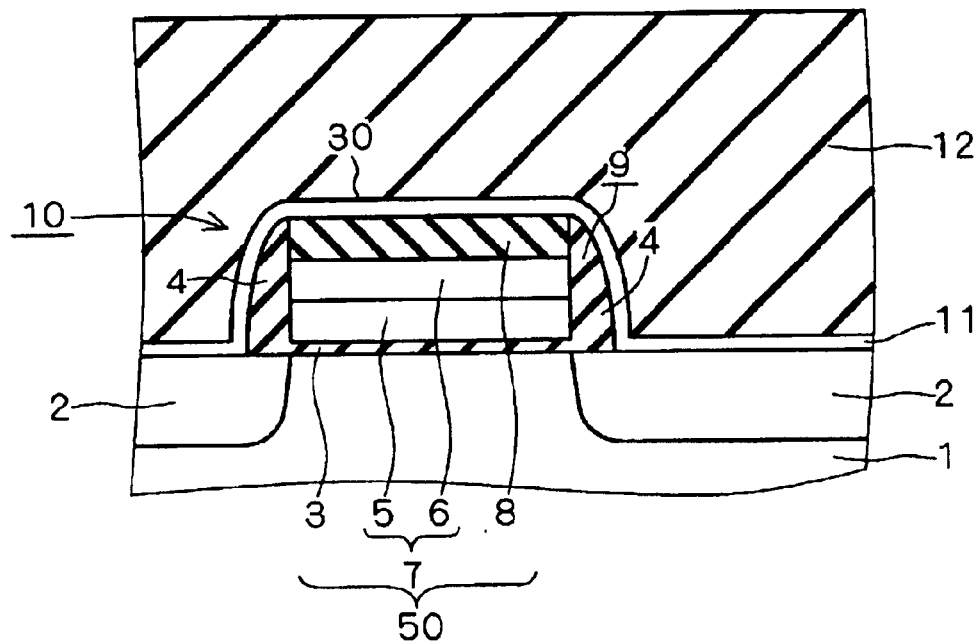
Figure 5:
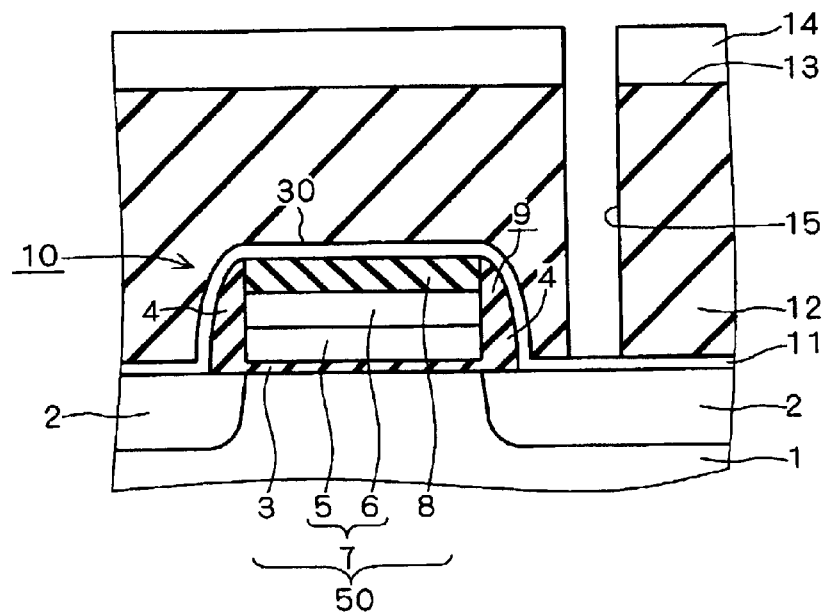
Figure 6:
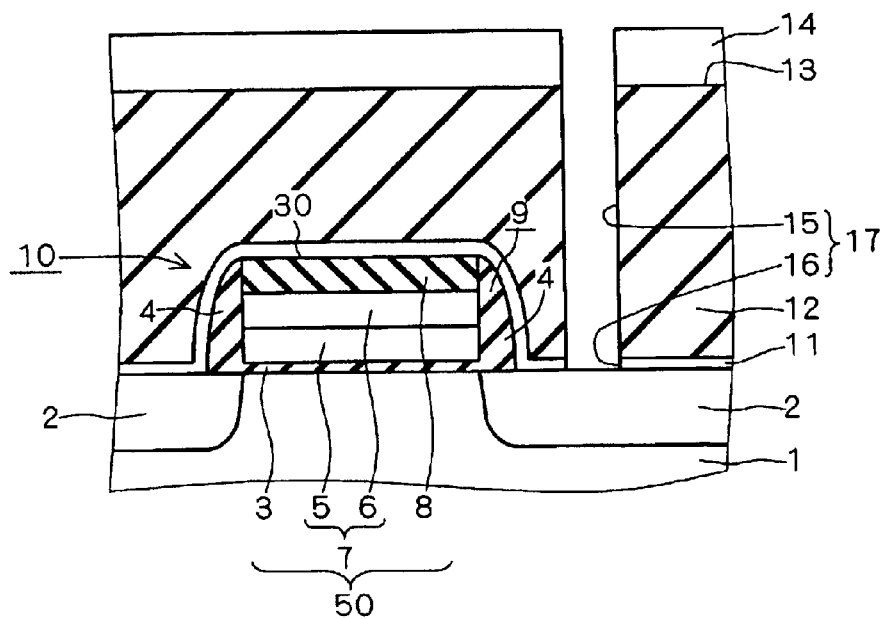

On the stopper film 11, as shown in FIG. 4, the interlayer insulation film 12 is formed. Then, in the structure obtained by the step of FIG. 4, the contact hole 17 extending from the upper surface 13 of the interlayer insulation film 12 to the semiconductor substrate 1 is formed as shown in FIGS. 5 and 6. More specifically, as shown in FIG. 5, a resist 14 with a predetermined pattern formed by photolithographic techniques is formed on the interlayer insulation film 12 and, using the resist 14 as a mask, the interlayer insulation film 12 is selectively etched to form the contact hole 15 which extends from the upper surface 13 of the interlayer insulation film 12 to the stopper film 11. At this time, the stopper film 11 is used as an etch stop and the interlayer insulation film 12 is etched by, for example, dry etching with selectivity to the stopper film 11. Then, as shown in FIG. 6, the stopper film 11 exposed by the formation of the contact hole 15 is selectively dry etched to form the contact hole 16 which extends to one of the source/drain regions 2. This completes the formation of the contact hole 17 which extends from the upper surface 13 of the interlayer insulation film 12 to the semiconductor substrate 1.

Figure 7:
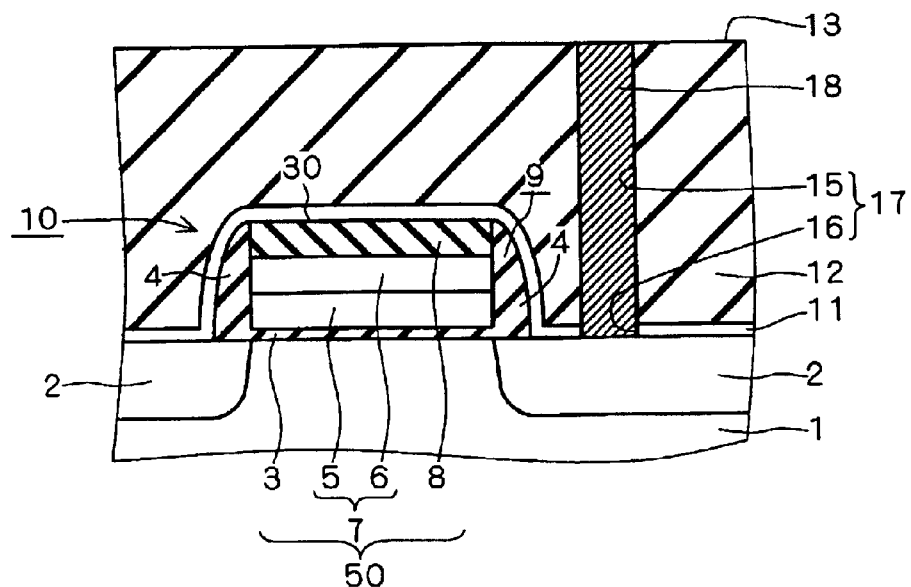
Figure 8:
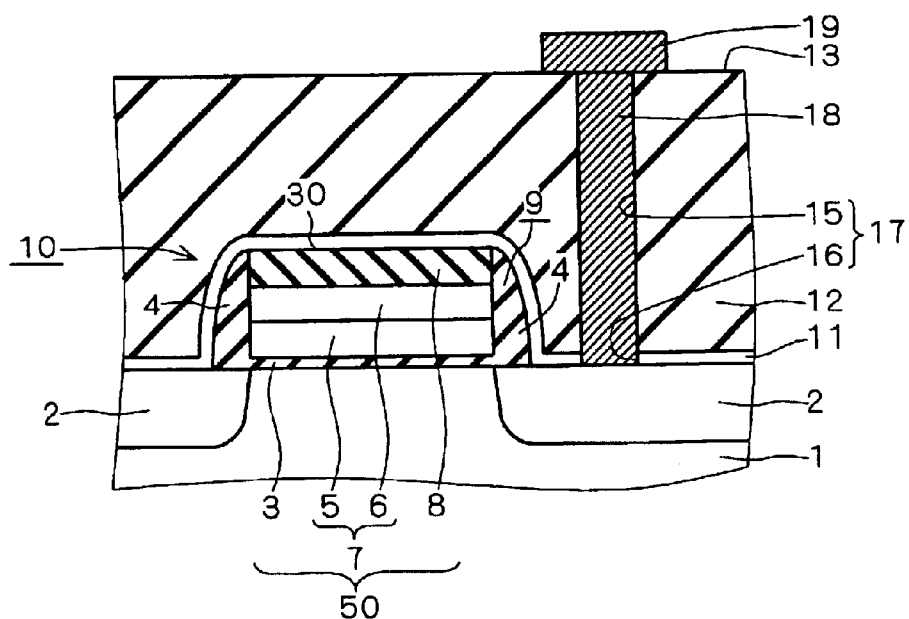
Figure 9:
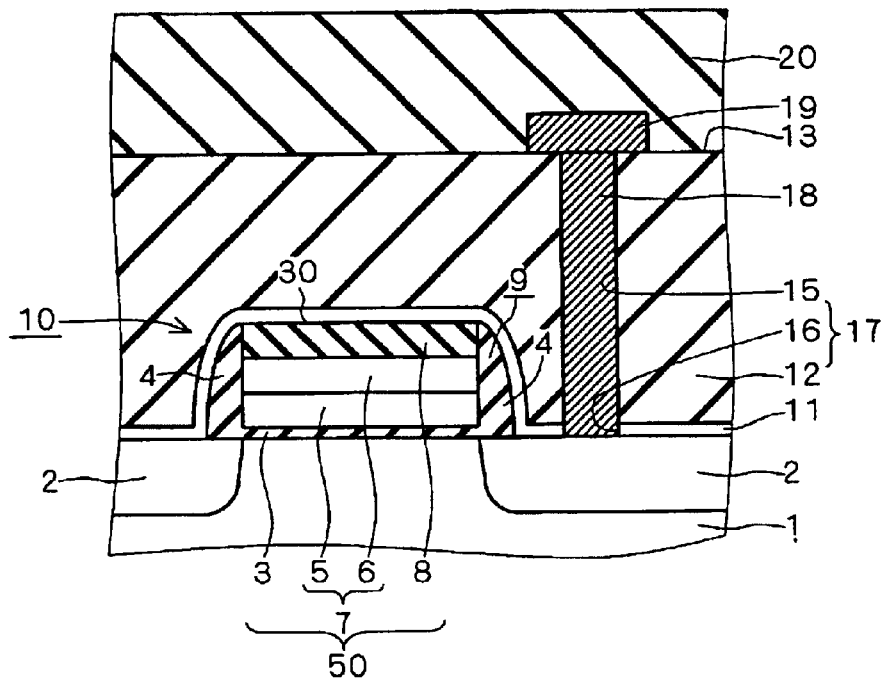
Figure 10:
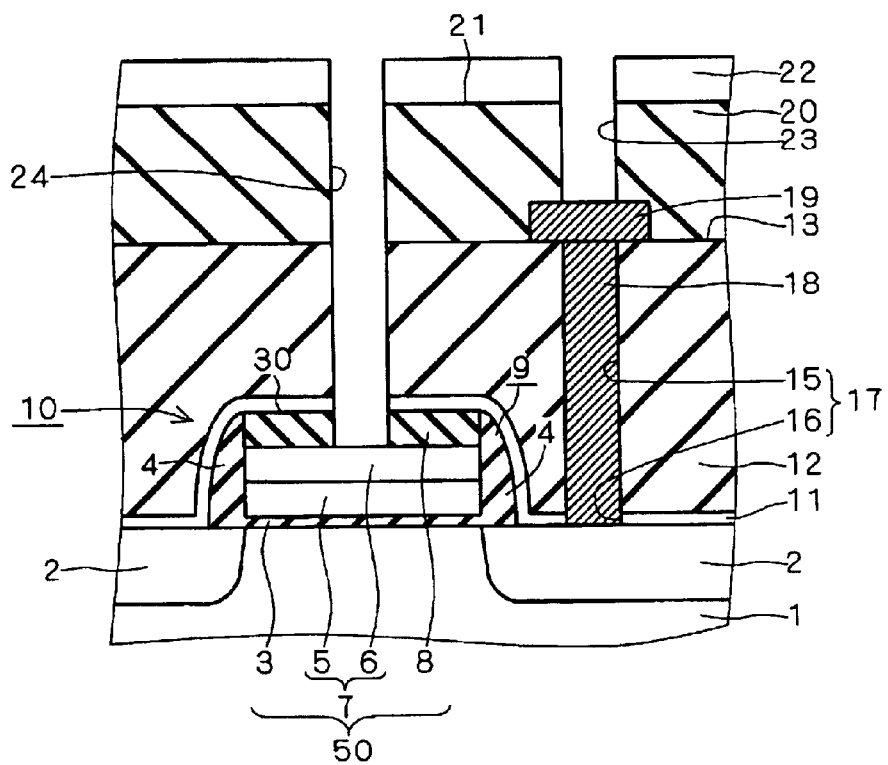

Then, as shown in FIG. 7, the resist 14 used in forming the contact hole 17 is removed and the metal material 18 is buried in the contact hole 17. On the interlayer insulation film 12, as shown in FIG. 8, the first metal wiring layer 19 is formed to be connected to the metal material 18. Further on the interlayer insulation film 12, as shown in FIG. 9, the interlayer insulation film 20 is formed to cover the first metal wiring layer 19. Then, in the structure obtained by the step of FIG. 9, the contact hole 24 which extends from the upper surface 21 of the interlayer insulation film 20 to the gate electrode 7 of the gate structure 9 and the contact hole 23 which extends from the upper surface 21 of the interlayer insulation film 20 to the first metal wiring layer 19 are formed in a single step as shown in FIG. 10. More specifically, a resist 22 with a predetermined pattern is formed on the interlayer insulation film 20. Using the resist 22 as a mask, the interlayer insulation films 12 and 20, the stopper film 11 and the insulation film 8 of the gate structure 9 are selectively removed by reactive ion etching, thereby to simultaneously form the contact holes 23 and 24.

At this time, there is a difference between the distance from the upper surface 21 of the interlayer insulation film 20 to the upper surface of the gate electrode 7 of the gate structure 9 and the distance from the upper surface 21 of the interlayer insulation film 20 to the first metal wiring layer 19; therefore, the interlayer insulation films 12 and 20, the stopper film 11 and the insulation film 8 of the gate structure 9 must be etched with high selectivity to the first metal wiring layer 19. Since, in general, metals such as copper and aluminum are resistant to chemical reaction with reactive gases such as $CF_4$ and $CHF_3$ as compared with silicon oxide film and silicon nitride film, the etch rate of metals such as aluminum in reactive ion etching is extremely smaller than that of silicon oxide film and silicon nitride film. From the fact that the interlayer insulation films 12, 20 and the insulation film 8 are of silicon oxide film, the stopper film 11 is of silicon nitride film, and the first metal wiring layer 19 is of aluminum, the use of reactive ion etching as in this preferred embodiment allows the interlayer insulation films 12 and 20, the stopper film 11 and the insulation film 8 of the gate structure 9 to be etched with high selectivity to the first metal wiring layer 19. In the method of manufacturing the semiconductor device according to this preferred embodiment, therefore, the contact holes 23 and 24 can be formed in a single step.

The resist 22 used in the step of FIG. 10 is then removed and the contact holes 24 and 23 are filled with the metal materials 25 and 26, respectively. Then, on the interlayer insulation film 20, the second metal wiring layers 27 and 28 are formed to be connected respectively to the metal materials 25 and 26. This provides connection between one of the source/drain regions 2 and the second metal wiring layer 28 and between the gate electrode 7 of the gate structure 9 and the second metal wiring layer 27, thereby completing the formation of the semiconductor device shown in FIG. 1 according to this preferred embodiment.

As above described, according to the method of manufacturing the semiconductor device of this preferred embodiment, in the step of FIG. 10, the contact hole 24 extending from the upper surface 21 of the interlayer insulation film 20 to the gate electrode 7 of the gate structure 9 can be formed at the same time as the contact hole 23 extending from the upper surface 21 of the interlayer insulation film 20 to the first metal wiring layer 19. Accordingly, a smaller number of masking processes is required than would be required in the aforementioned conventional semiconductor device manufacturing method illustrated in FIGS. 16 through 20 in which, instead of forming the contact hole 24, contact holes in the respective interlayer insulation films 102 and 129 are formed in different steps.

Figure 16:
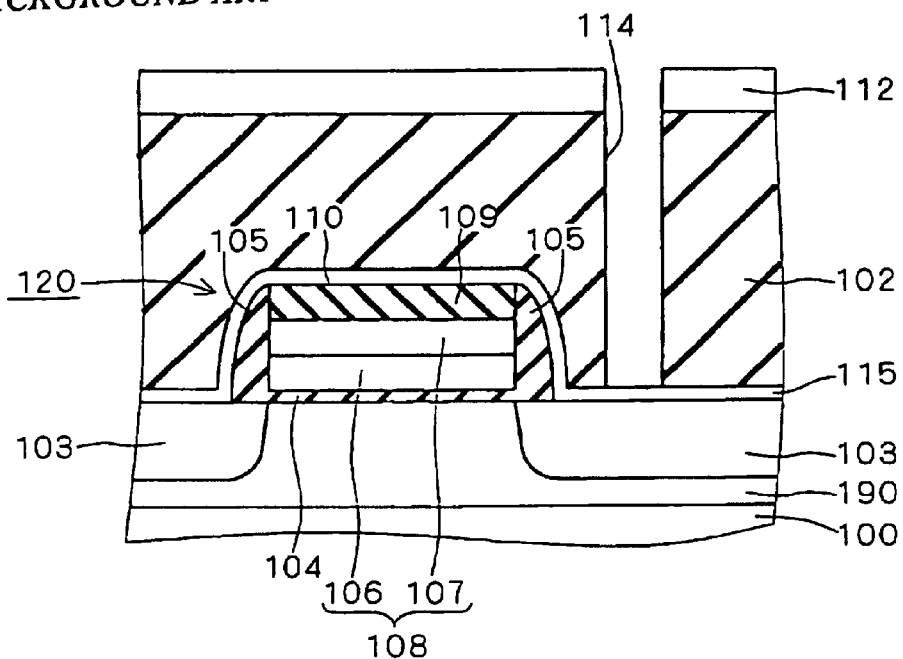
FIGS. 16 to 20 are cross-sectional views illustrating the manufacturing process of a conventional semiconductor device.
Figure 17:
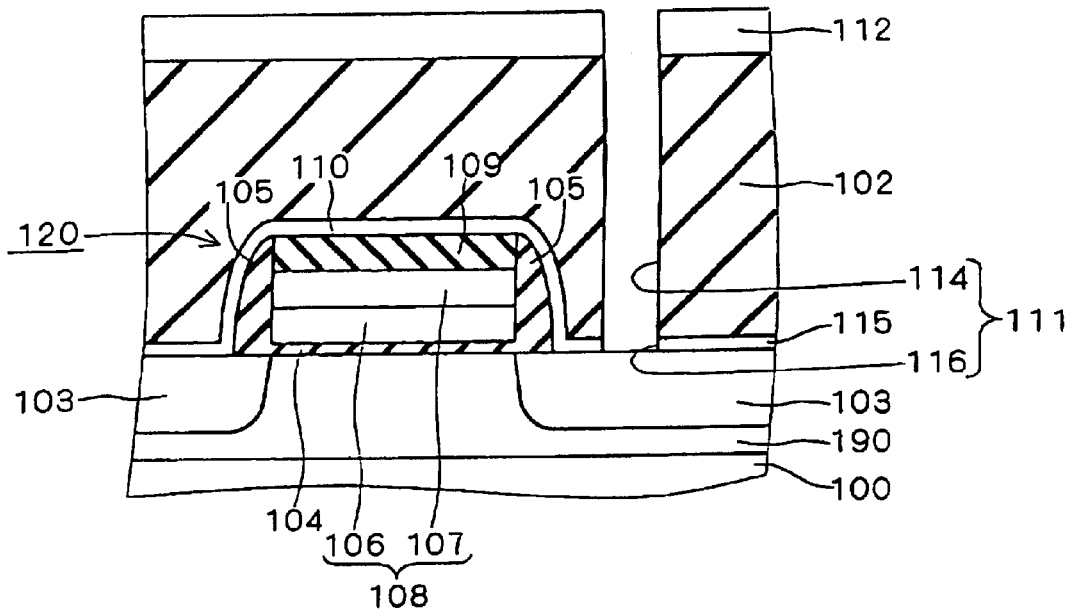
Figure 18:
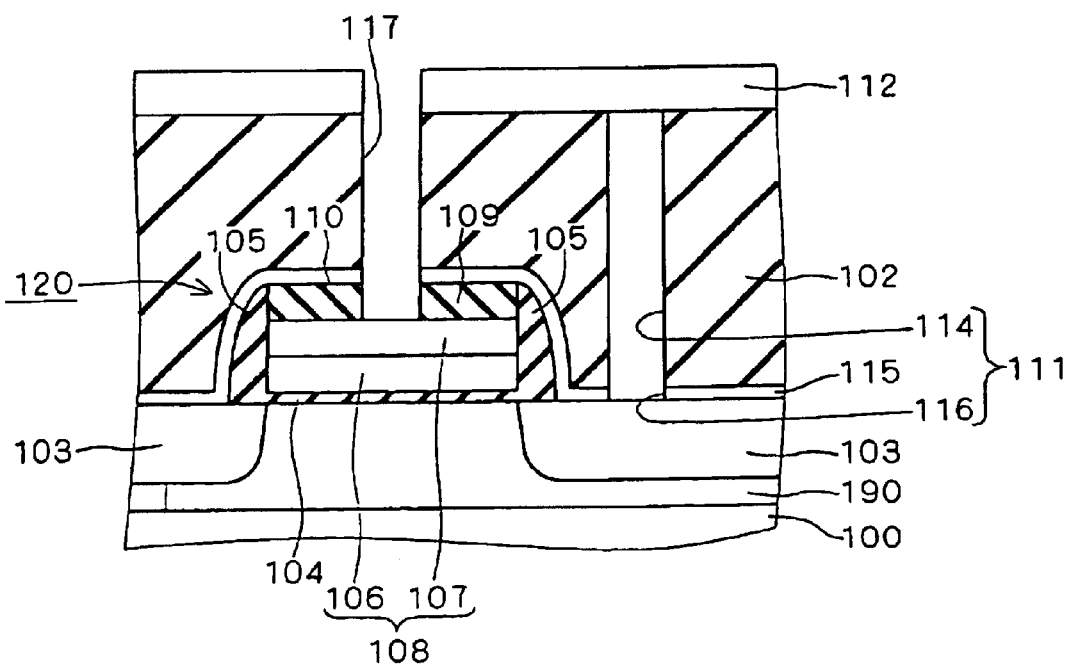
Figure 19:
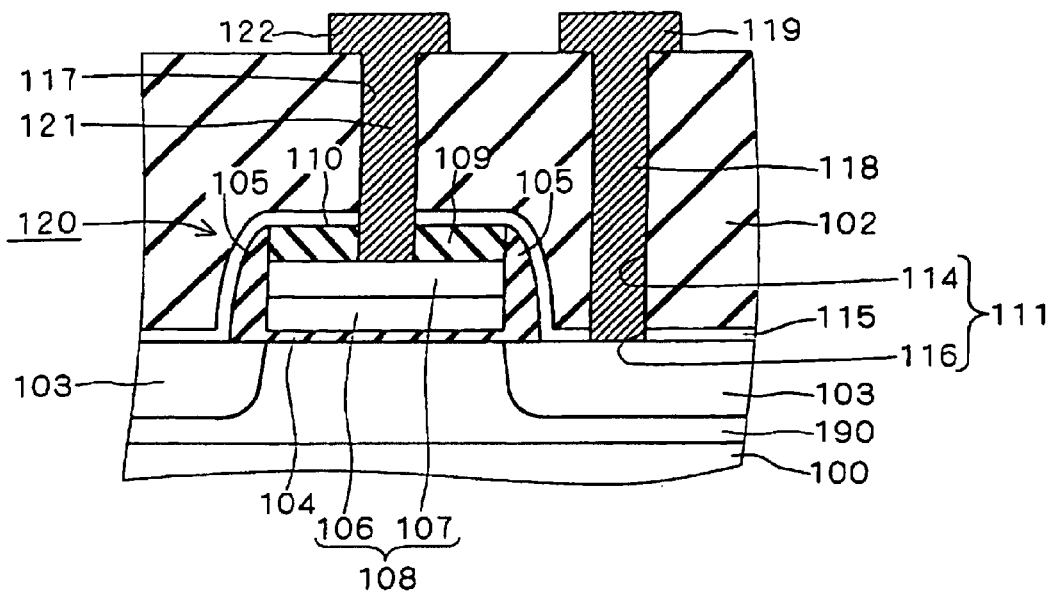

To be more specific, according to the conventional semiconductor device manufacturing method, in order to provide connection between the second metal wiring layer 128 and the gate electrode 108 of the gate structure 110, the contact hole 117 is first formed to connect the first metal wiring layer 122 and the gate electrode 108 and then, the contact hole 124 is formed to connect the second metal wiring layer 128 and the first metal wiring layer 122. Since, as above described, it was difficult to form the contact hole 117 for connection between the first metal wiring layer 122 and the gate electrode 108 at the same time as the contact hole 111 for connection between one of the source/drain regions 103 and the first metal wiring layer 119, the contact holes 111 and 117 are formed in different steps. As a result, a total of three masking processes as illustrated in FIGS. 16, 18 and 20 are necessary to establish connection between the second metal wiring layer 127 and one of the source/drain regions 103 and between the second metal wiring layer 128 and the gate electrode 108 of the gate structure 110.

In the semiconductor manufacturing method according to the preferred embodiment of the present invention, on the other hand, the contact hole 24 extending from the upper surface 21 of the interlayer insulation film 20 to the gate electrode 7 of the gate structure 9 is formed at the same time as the contact hole 23 without forming an additional first metal wiring layer. Thus, connection between the second metal wiring layer 28 and one of the source/drain regions 2 and between the second metal wiring layer 27 and the gate electrode 7 of the gate structure 9 can be established by the execution of a total of two masking processes as illustrated in FIGS. 5 and 10. As a result, the required number of masking processes becomes smaller than would be required in the conventional semiconductor device manufacturing method.

Figure 20:
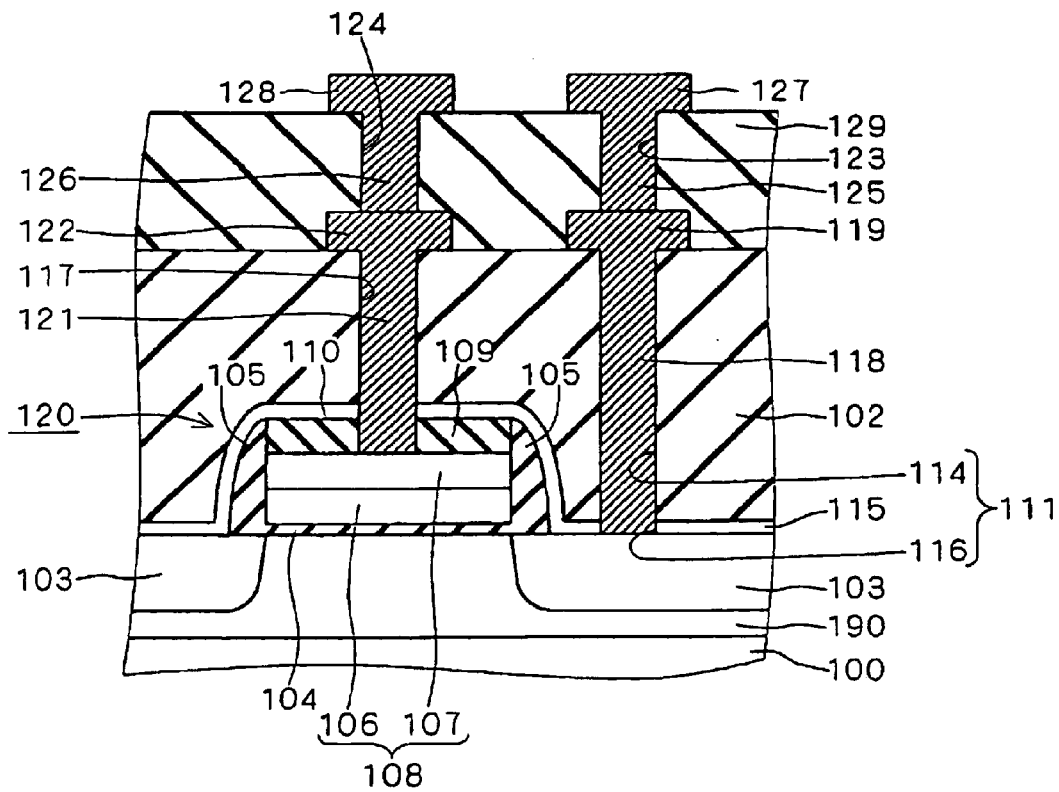

Expressed differently, since the semiconductor device according to this preferred embodiment, unlike the conventional semiconductor device shown in FIG. 20, comprises the contact hole 24 extending from the upper surface 21 of the interlayer insulation film 20 to the gate electrode 7 of the gate structure 9, it can be manufactured by the semiconductor device manufacturing method according to this preferred embodiment illustrated in FIGS. 2 through 10. Accordingly, the contact hole 24 therein extending from the upper surface 21 of the interlayer insulation film 20 to the gate electrode 7 of the gate structure 9 can be formed at the same time as the contact hole 23 which extends from the upper surface 21 of the interlayer insulation film 20 to the first metal wiring layer 19. As a result, for the aforementioned reason, a smaller number of masking processes is required when manufacturing the semiconductor device shown in FIG. 1 according to this preferred embodiment than would be required when manufacturing the conventional semiconductor device shown in FIG. 20 which, instead of including the contact hole 24, includes independent contact holes in the respective interlayer insulation films 102 and 129.

Figure 11:
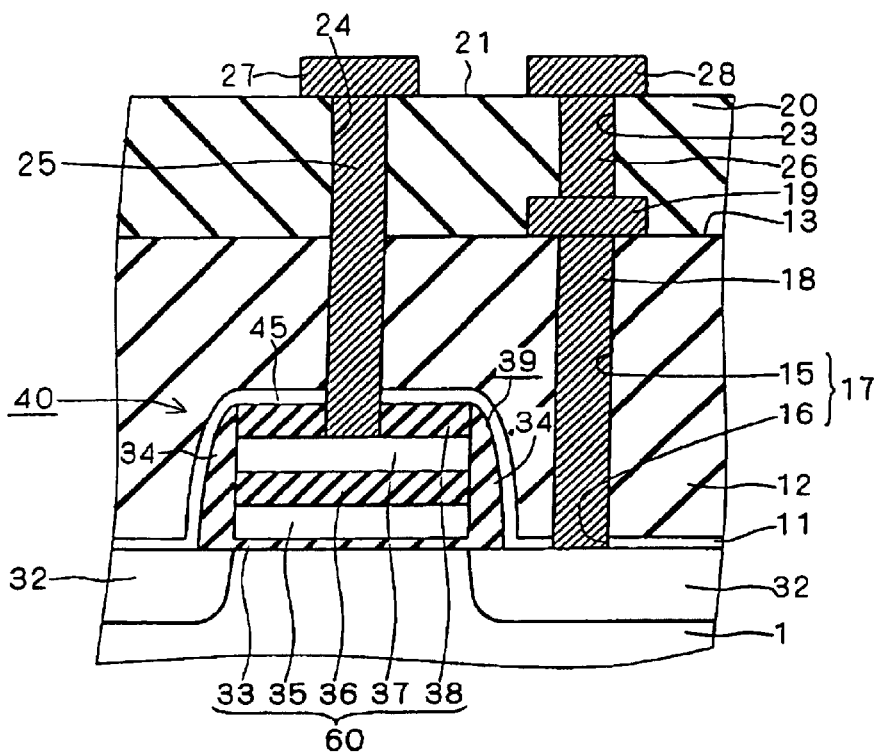
FIG. 11 is a cross-sectional view illustrating a modification of the semiconductor device structure according to the preferred embodiment of the present invention.

While the semiconductor device according to this preferred embodiment comprises MOS transistors as semiconductor elements with gate structures, it should be noted that the present invention is also applicable to other semiconductor devices which comprise semiconductor elements, other than MOS transistors, with gate structures where a gate electrode and an insulation film are stacked one above the other in order from the semiconductor substrate side, and in which contact holes extending to the gate electrodes of the gate structures are formed. As one example, a brief description is made of the case where the present invention is applied to a semiconductor device comprising, as semiconductor elements with gate structures, memory cells of a flash memory which is a kind of a nonvolatile memory. FIG. 11 is a cross-sectional view in schematic form illustrating a modification of the semiconductor device according to the preferred embodiment of the present invention. The semiconductor device shown in FIG. 11 comprises flash memory cells 40 instead of the MOS transistors 10 in the semiconductor device shown in FIG. 1. Referring to FIG. 11, the flash memory cells 40 each comprise source/drain regions 32 formed in the surface of the semiconductor substrate 1, and a gate structure 39 formed on the semiconductor substrate 1 and having a layered structure 60 in which a tunnel oxide film 33, a gate electrode 35 called a "floating gate", an interlayer oxide film 36, a gate electrode 37 called a "control gate" and an insulation film 38 are stacked one above another in order from the semiconductor substrate 1 side.

The gate structure 39 further has sidewalls 34 formed on the side surfaces of the layered structure 60 and is formed on the surface of the semiconductor substrate 1 sandwiched between the source/drain regions 32. The interlayer oxide film 36 has a structure in which silicon oxide film, silicon nitride film and silicon oxide film are stacked one above another in this order and is thus called an "ONO film". The tunnel oxide film 33 and the insulation film 38 are formed of, for example, silicon oxide film, the gate electrode 35 is formed of, for example, polysilicon film, and the gate electrode 37 is formed of, for example, tungsten silicide film. The stopper film 11 is formed on the semiconductor substrate 1 to cover a surface 45 of the gate structure 39 of the flash memory cell 40, and the contact hole 24 extends from the upper surface 21 of the interlayer insulation film 20 to the gate electrode 37 of the gate structure 39. The other components of the structure are identical to those in the semiconductor device shown in FIG. 1 and will not be described herein.

Figure 12:
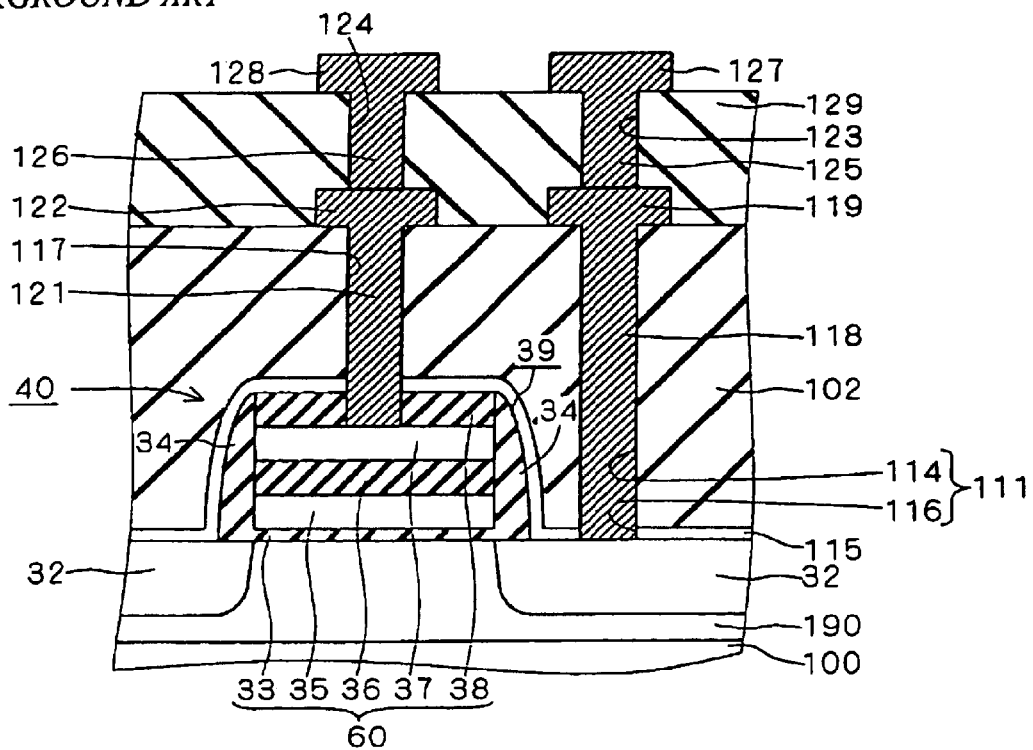
FIGS. 12 to 15 are cross-sectional views illustrating a conventional semiconductor device structure.
Figure 13:
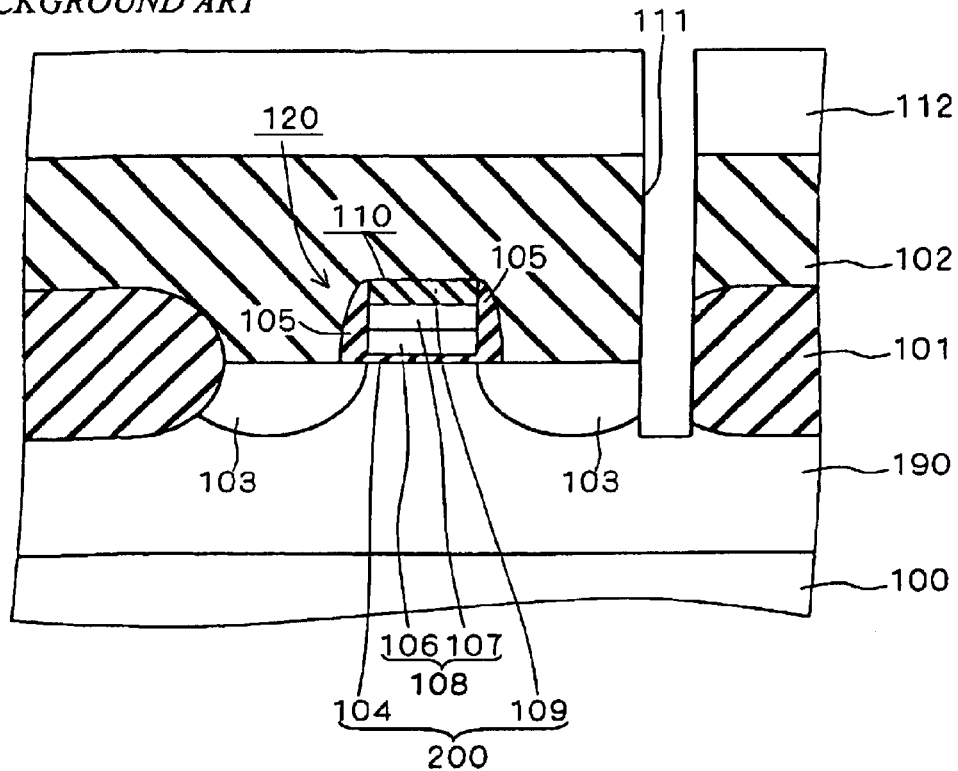
Figure 14:
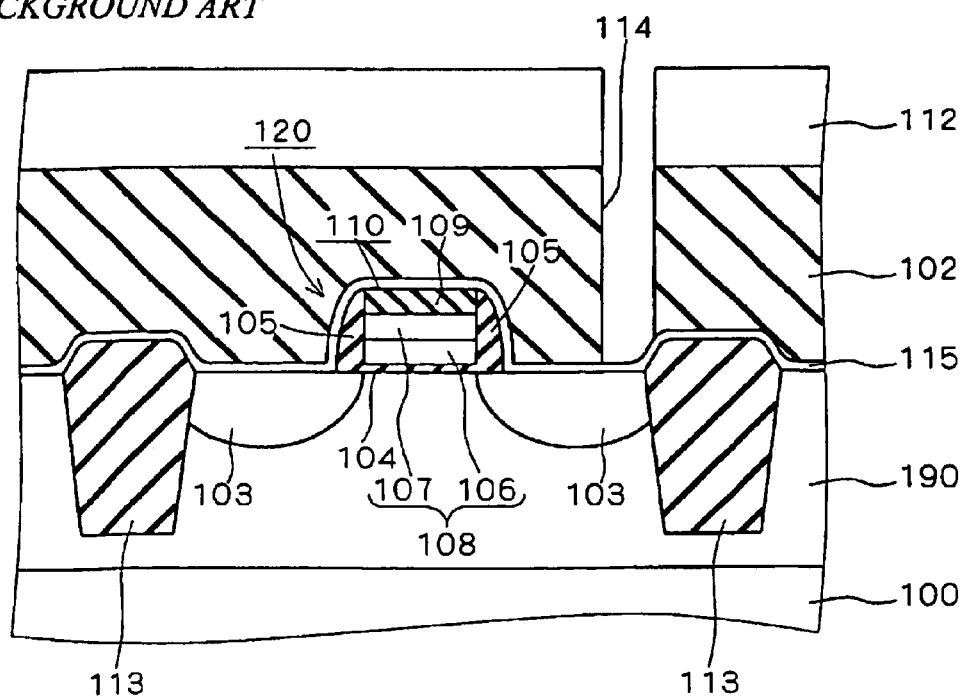
Figure 15:
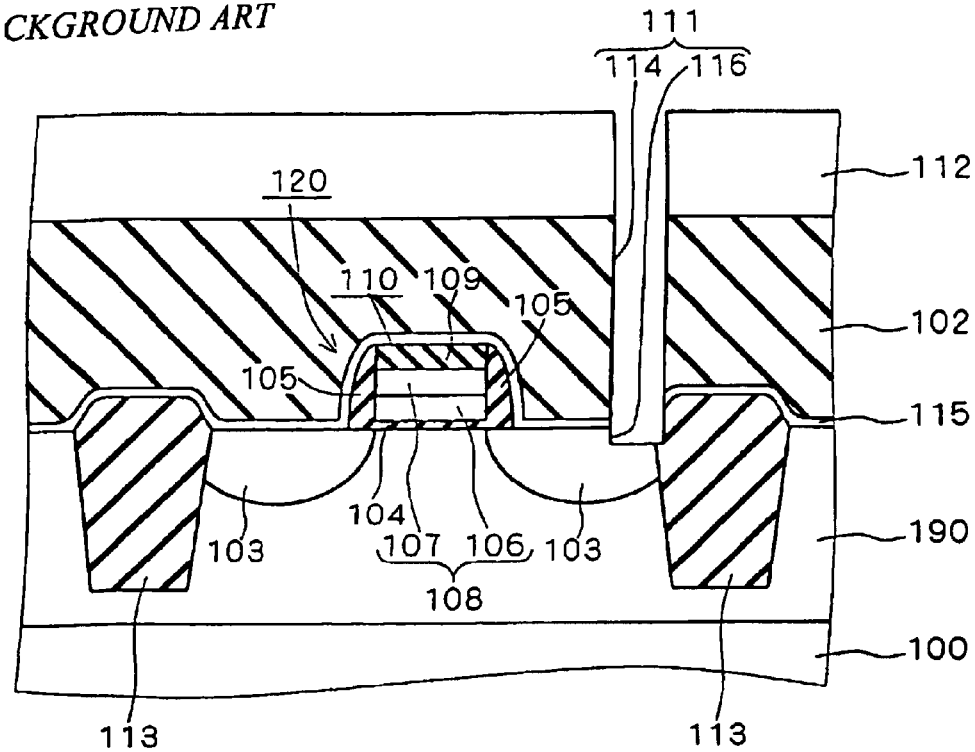

Here, consider the case where the conventional semiconductor device shown in FIG. 20 comprises, instead of the MOS transistors 120, the above-mentioned flash memory cells 40 (hereinafter this semiconductor device is referred to as "a semiconductor device according to a second conventional technique"). FIG. 12 is a cross-sectional view in schematic form illustrating a semiconductor device structure according to the second conventional technique. In the semiconductor device shown in FIG. 12, for the same reason as in the case of the semiconductor device shown in FIG. 20, it is difficult to form the contact hole 117 for connection between the first metal wiring layer 122 and the gate electrode 37 of the flash memory cell 40 at the same time as the contact hole 111 for connection between one of the source/drain regions 103 and the first metal wiring layer 119. Accordingly, three masking processes are necessary to manufacture the semiconductor device according to the second conventional technique. In the semiconductor device shown in FIG. 11, on the other hand, since it includes the contact hole 24 extending from the upper surface 21 of the interlayer insulation film 20 to the gate electrode 37 of the gate structure 39, it is possible to form the contact hole 24 at the same time as the contact hole 23 extending from the upper surface 21 of the interlayer insulation film 20 to the first metal wiring layer 19. As a result, for the same reason as above described, a smaller number of masking processes is required than would be required when manufacturing the semiconductor device according to the second conventional technique.

Moreover, the gate structure of a flash memory cell is generally double layered having two gate electrodes and thus is thicker than that of a normal MOS transistor, e.g., a gate structure having a single layered gate electrode. Thus, the contact hole 24 can be formed at a shallower depth when the gate structure of a flash memory cell is adopted as the gate structure of the present invention, than when a gate structure having a single layered gate electrode is adopted. This reduces the amount of the metal wiring layer 19 to be removed in forming the contact holes 23 and 24 in a single step, thereby allowing stable formation of the contact hole 23.

While the invention has been shown and described in detail, the foregoing description is in all aspects illustrative and not restrictive. It is therefore understood that numerous modifications and variations can be devised without departing from the scope 0of the invention.

What is claimed is:

1. A semiconductor device, comprising:
a semiconductor substrate;
a gate structure selectively formed on said semiconductor substrate and having a layered structure in which a gate electrode and an insulation film are stacked one above the other in order from said semiconductor substrate side;
an active region formed in a main surface of said semiconductor substrate;
a stopper film covering a whole surface of said gate structure and formed on said active region;
a first interlayer insulation film formed on said stopper film;
a first contact hole extending from an upper surface of said first interlayer insulation film to said active region;
a metal material buried in said first contact hole;
a metal wiring layer formed on said first interlayer insulation film to be connected to said metal material;
a second interlayer insulation film formed on said first interlayer insulation film to cover said metal wiring layer;
a second contact hole extending from an upper surface of said second interlayer insulation film through said first interlayer insulation film, said stopper film and said insulation film to said gate electrode of said gate structure; and
a third contact hole extending from the upper surface of said second interlayer insulation film to said metal wiring layer, said third contact hole being shallower than said second contact hole,
wherein an etch rate of a film in forming said second and third contact holes is larger than that of said metal wiring layer.

2. The semiconductor device according to claim 1, wherein
said insulation film and said first and second interlayer insulation films are formed of silicon oxide film,
said stopper film is formed of silicon nitride film, and
said metal wiring layer contains copper or aluminum.

3. The semiconductor device according to claim 1, wherein said gate structure comprises:
a gate structure of a flash memory cell.

4. The semiconductor device according to claim 2, wherein wherein said gate structure comprises:
a gate structure of a flash memory cell.

* * * * *